US011502235B2

(12) United States Patent
Tsurumi et al.

(10) Patent No.: US 11,502,235 B2
(45) Date of Patent: Nov. 15, 2022

(54) THERMOELECTRIC MATERIAL AND THERMOELECTRIC MODULE

(71) Applicants: HAKUSAN, INC., Ishikawa (JP); JAPAN ADVANCED INSTITUTE OF SCIENCE AND TECHNOLOGY, Ishikawa (JP); ISHIKAWA PREFECTURE, Ishikawa (JP)

(72) Inventors: Shigeyuki Tsurumi, Ishikawa (JP); Kazumasa Yasuda, Ishikawa (JP); Takeshi Sotome, Ishikawa (JP); Mikio Koyano, Ishikawa (JP); Takeshi Toyoda, Ishikawa (JP); Akinari Matoba, Ishikawa (JP); Toshiharu Minamikawa, Ishikawa (JP)

(73) Assignees: HAKUSAN, INC., Ishikawa (JP); JAPAN ADVANCED INSTITUTE OF SCIENCE AND TECHNOLOGY, Ishikawa (JP); ISHIKAWA PREFECTURE, Ishikawa (JP)

(*) Notice: Subject to any disclaimer, the term of this patent is extended or adjusted under 35 U.S.C. 154(b) by 0 days.

(21) Appl. No.: 16/641,220

(22) PCT Filed: Aug. 10, 2018

(86) PCT No.: PCT/JP2018/030049
§ 371 (c)(1),
(2) Date: Feb. 21, 2020

(87) PCT Pub. No.: WO2019/039320
PCT Pub. Date: Feb. 28, 2019

(65) Prior Publication Data
US 2020/0227609 A1 Jul. 16, 2020

(30) Foreign Application Priority Data
Aug. 22, 2017 (JP) .............................. JP2017-159221

(51) Int. Cl.
*H01L 35/22* (2006.01)
*H01L 35/04* (2006.01)

(52) U.S. Cl.
CPC .............. *H01L 35/22* (2013.01); *H01L 35/04* (2013.01)

(58) Field of Classification Search
None
See application file for complete search history.

(56) References Cited

U.S. PATENT DOCUMENTS 3,782,927 A * 1/1974 Nicolaou ................ H01L 35/20
136/239
2005/0002818 A1* 1/2005 Ichikawa .................. B22F 7/02
419/6
(Continued)

FOREIGN PATENT DOCUMENTS

EP 2 548 845 A1 1/2013
JP 05-183196 A 7/1993
(Continued)

OTHER PUBLICATIONS

Machine translation of JP2015-053466A (Year: 2015).*
(Continued)

*Primary Examiner* — Ryan S Cannon
(74) *Attorney, Agent, or Firm* — McDermott Will & Emery LLP

(57) ABSTRACT

A thermoelectric material includes a parent phase in which an MgSiSn alloy is a main component, a void formed in the parent phase, and a silicon layer that is formed on at least a wall surface of the void and that includes silicon as a main component. The thermoelectric material further includes MgO in an amount of 1.0 wt. % or more and 20.0 wt. % or less. The silicon layer includes amorphous Si, or amorphous Si and nanosized Si crystals, and the parent phase includes a region in which the composition ratio of the Si of the
(Continued)

Image captured by FE-SEM chemical composition of the MgSiSn alloy is higher than in the other regions and a region in which the composition ratio of the Sn of the chemical composition of the MgSiSn alloy is higher than in the other regions. With these configurations, the thermoelectric material realizes both lower thermal conductivity and lower electrical resistivity.

9 Claims, 15 Drawing Sheets

(56) References Cited

U.S. PATENT DOCUMENTS

| | | | |
|---|---|---|---|
| 2007/0240749 A1 | 10/2007 | Ohtaki | |
| 2010/0040838 A1* | 2/2010 | Abdallah | H01L 21/31138 428/195.1 |
| 2014/0230875 A1* | 8/2014 | Angermann | H01L 35/28 136/230 |
| 2017/0301845 A1 | 10/2017 | Tada et al. | |

FOREIGN PATENT DOCUMENTS

| | | | |
|---|---|---|---|
| JP | H05-183196 A | | 7/1993 |
| JP | 2000006298 A | * | 1/2000 |
| JP | 2014-165247 A | | 9/2014 |
| JP | 2015/053466 A | | 3/2015 |
| JP | 2015-053466 A | | 3/2015 |
| JP | 2015-53466 A | | 3/2015 |
| JP | 2015053466 A | * | 3/2015 |
| JP | 2016-132608 A | | 7/2016 |
| WO | 2005/091393 A1 | | 9/2005 |
| WO | 2016/052272 A1 | | 4/2016 |

OTHER PUBLICATIONS

Q. Zhang et al., "High figures of merit and natural nanostructures in Mg2Si0.4Sn based thermoelectric materials", Applied Physics Letters 93, 102109 (Year: 2008).*

A. S. Tazebay et al., "Thermal transport driven by extraneous nanoparticles and phase segregation in nanostructured Mg2(Si,Sn) and estimation of optimum thermoelectric performance", Applied Materials and Interfaces 8, p. 7003-7012 (Year: 2016).*

P. Bellanger et al., "Effect of microstructure on the thermal conductivity of nanostructured Mg2(Si,Sn) thermoelectric alloys: An experimental and modeling approach", Acta Materialia 95, p. 102-110 (Year: 2015).*

J. Mao et al, "Thermoelectric performance enhancement of Mg2Sn based solid solutions by band convergence and phonon scattering via Pb and Si/Ge substitution for Sn", Physical Chemistry Chemical Physics 18, p. 20726-20737 (Year: 2016).*

"Silicon" [retrieved from https://en.wikipedia.org/wiki/Silicon on Mar. 9, 2022].*

G. Bernard-Granger et al., "Influence of the addition of Half-Heusler nanoparticles on the thermoelectric properties of an N-type magnesium-silicon-tin alloy", Scripta Materialia 104, p. 5-8 (Year: 2015).*

N. Vlachos et al., "Effect of antimony-doping and germanium on the highly efficient thermoelectric Si-rich-Mg2(Si,Sn,Ge) materials", Journal of Alloys and Compounds 714, p. 502-513 (Year: 2017).*

K. Yin et al., "Morphology modulation of SiC nano-additives for mechanical robust high thermoelectric performance Mg2Si1-xSnx/SiC nano-composites", Scripta Materialia 126, p. 1-5 (Year: 2017).*

International Search Report issued in International Patent Application No. PCT/JP2018/030049, dated Nov. 6, 2018, with English translation.

Martin Søndergaard et al., "Thermal stability and thermoelectric properties of Mg2Si0.4Sn0.6 and Mg2Si0.6Sn0.4", Journal of Materials Science, vol. 48, No. 5, Oct. 26, 2012, pp. 2002-2008.

Extended European Search Report issued in corresponding European Patent Application No. 18847943.0-1211, dated Mar. 9, 2021.

European Office Action issued in corresponding European Patent Application No. 18847943.0-1211, dated Mar. 26, 2021.

Office Action issued in corresponding Japanese Application No. 2019-538076 dated Jul. 25, 2022, with English Translation (9 pages).

* cited by examiner

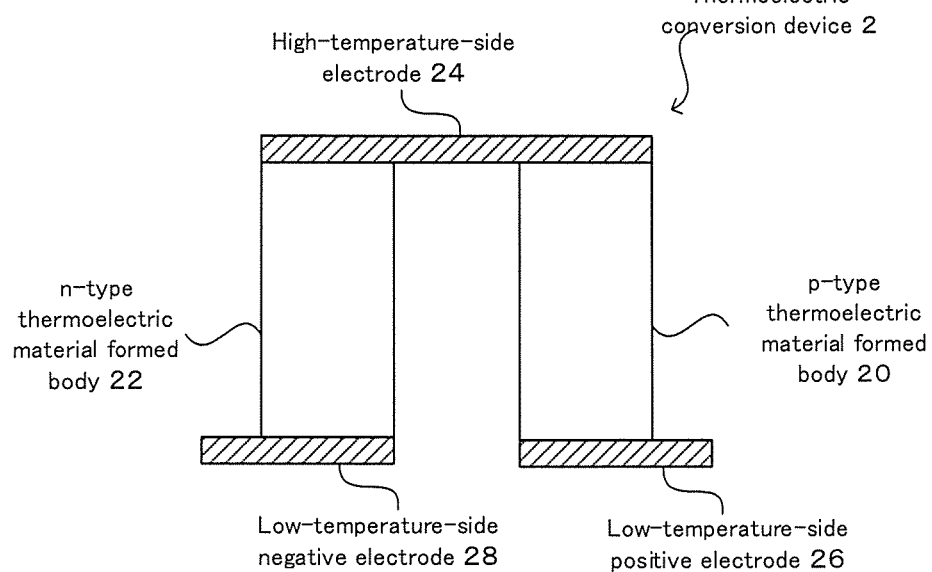
Thermoelectric conversion device 2
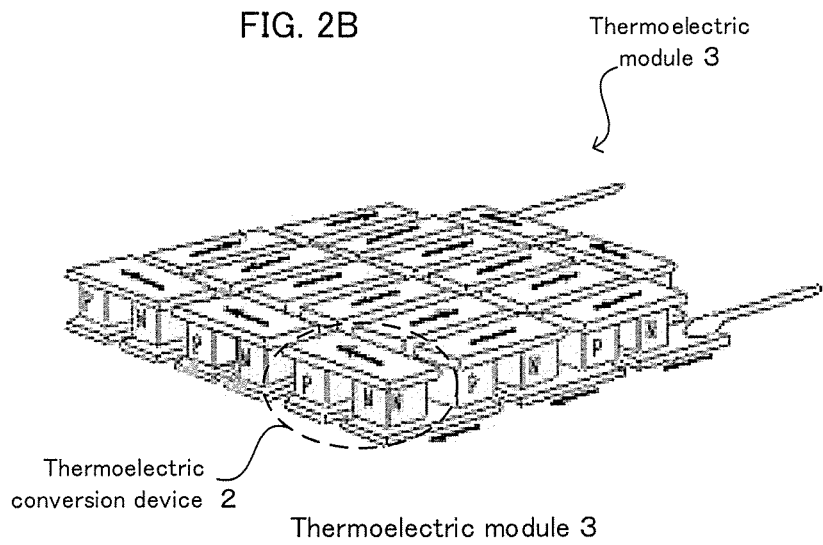
Thermoelectric module 3

Method (S10) of manufacturing thermoelectric material formed body

Electrical resistivity and void content along with added amount of PVA

FIG. 5A
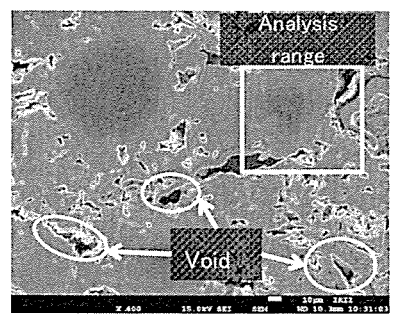
Image captured by FE-SEM
FIG. 5B
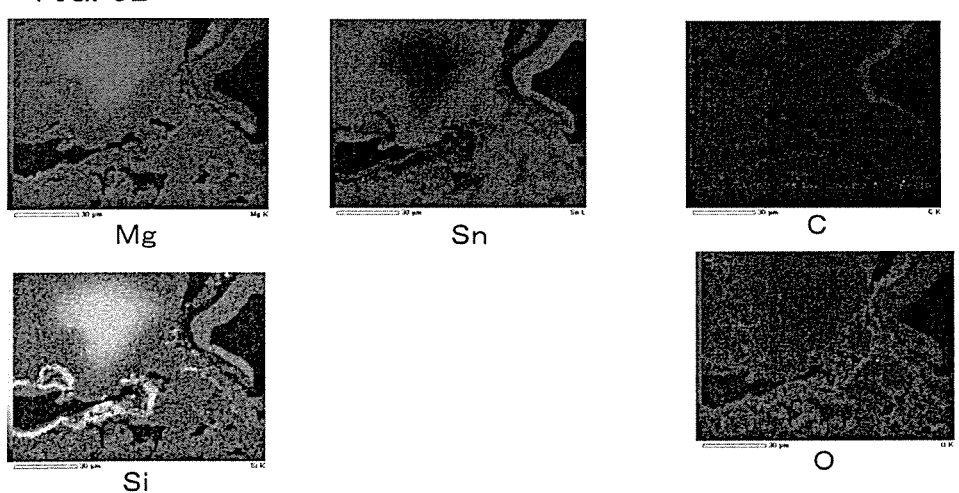
EDX element mapping analysis results
FIG. 5C
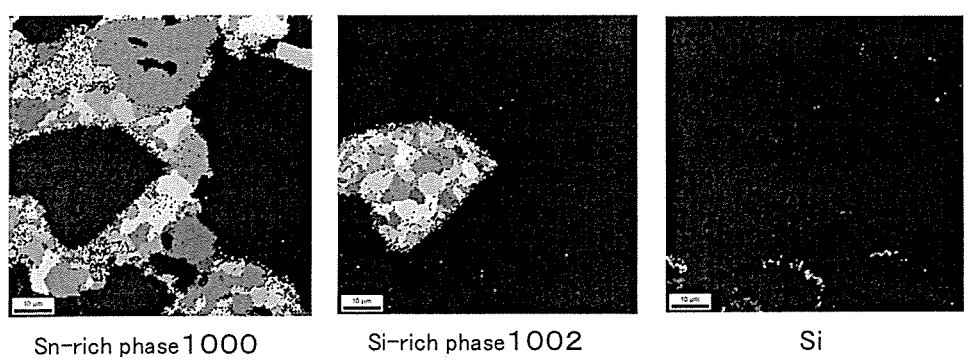
Sn-rich phase 1000    Si-rich phase 1002    Si
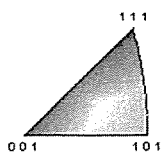 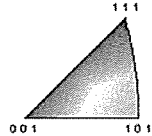 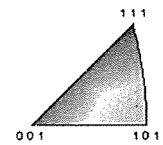
ESBD analysis results

|  | 25 | 200 | 300 | 400 | 500 | 600 | 700 | 760 |
|---|---|---|---|---|---|---|---|---|
| $Mg_2Si$ | 8.4 | 10 | 10 | 9.7 | 9.8 | 6.1 | 5.4 | 6.3 |
| Si | 1.1 | 0 | 2.6 | 2.9 | 2.8 | 0.8 | 0 | 0 |
| MgO | 9.6 | 0 | 3.8 | 5.3 | 10.5 | 16.9 | 18.2 | 15.9 |
| $Mg_2Sn$ | 0 | 0 | 60.4 | 60 | 56.9 | 0 | 0 | 0 |
| $Mg_2Si_{0.3}Sn_{0.7}$ | 80.9 | 84 | 16.2 | 15.8 | 15 | 74 | 72.9 | 76.3 |

Content of each component by temperature

Secondary sintering temperature and concentration of each component

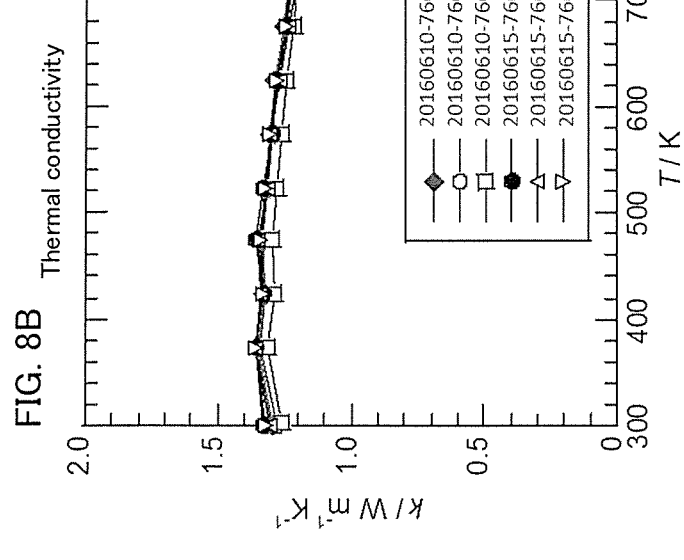
FIG. 8A Power factor
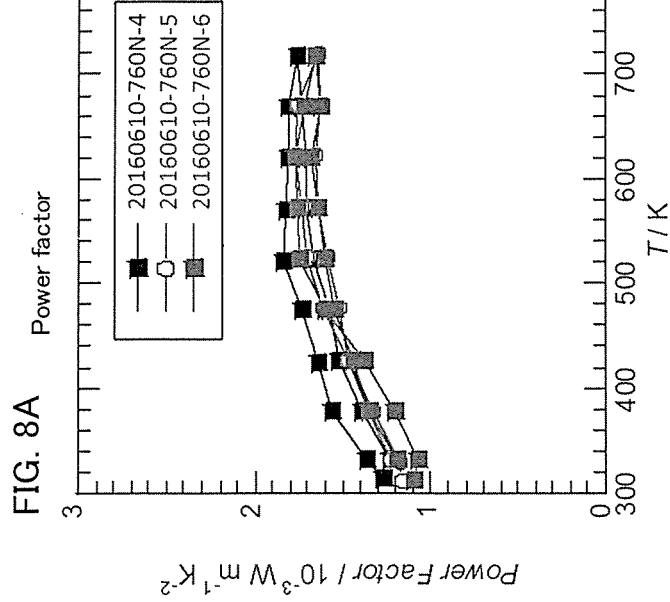
FIG. 8B Thermal conductivity

ZT in thermoelectric material 1 where Ge is substituted for Sn

Electrical resistivity of $Mg_{2.15}Si_{0.28}Sn_{0.70}Sb_{0.02}$ in which 4.5 wt.% of PVA is added Seebeck coefficient of $Mg_{2.15}Si_{0.28}Sn_{0.70}Sb_{0.02}$ in which 4.5 wt.% of PVA is added Power factor of $Mg_{2.15}Si_{0.28}Sn_{0.70}Sb_{0.02}$ in which 4.5 wt.% of PVA is added PVA added concentration and changes in electrical resistance in p-type thermoelectric material formed body 20

PVA added concentration and changes in tensile strength in n-type thermoelectric material formed body 22

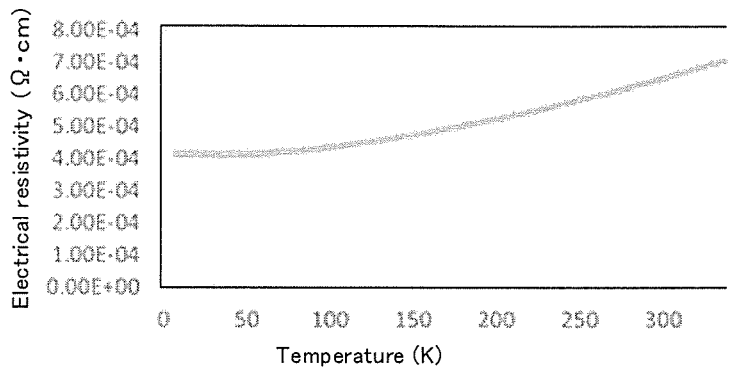
Electrical resistivity of secondary sintering at 760°C of $Mg_{2.2}Si_{0.28}Sn_{0.70}Sb_{0.02}$
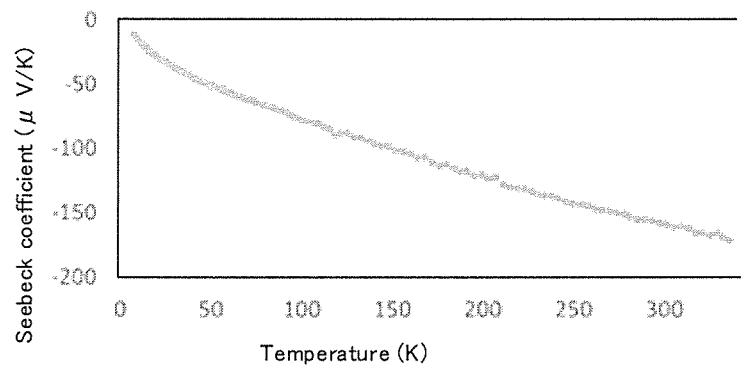
Seebeck coefficient of secondary sintering at 760°C of $Mg_{2.2}Si_{0.28}Sn_{0.70}Sb_{0.02}$
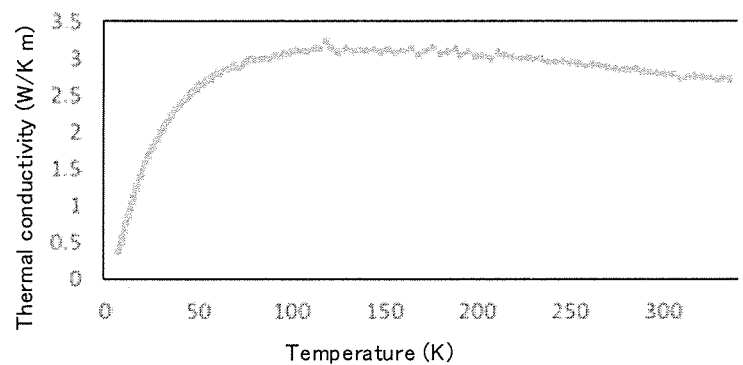
Thermal conductivity of secondary sintering at 760°C of $Mg_{2.2}Si_{0.28}Sn_{0.70}Sb_{0.02}$ ZT of secondary sintering at 760°C of $Mg_{2.2}Si_{0.28}Sn_{0.70}Sb_{0.02}$ Power factor of secondary sintering at 760°C of $Mg_{2.2}Si_{0.28}Sn_{0.70}Sb_{0.02}$ ZT of secondary sintering at 760°C of $Mg_{2.2}Si_{0.28}Sn_{0.70}Sb_{0.02}$

THERMOELECTRIC MATERIAL AND THERMOELECTRIC MODULE

CROSS-REFERENCE TO RELATED APPLICATIONS

This application is the U.S. National Phase under 35 U.S.C. § 371 of International Patent Application No. PCT/JP2018/030049, filed on Aug. 10, 2018, which in turn claims the benefit of Japanese Patent Application No. 2017-159221, filed on Aug. 22, 2017, the entire disclosures of which Applications are incorporated by reference herein.

TECHNICAL FIELD

The present invention relates to a thermoelectric material and a thermoelectric module.

BACKGROUND ART

Patent Literature 1, for example, discloses a thermoelectric material that includes, as a main component, one of a magnesium-silicon alloy, a magnesium-silicon-tin alloy, silicon, and silicon-germanium alloy, wherein the thermoelectric material is formed from a porous substance having a plurality of small pores.

Patent Literature 2 discloses a method for producing a thermoelectric conversion material, the method including: when creating a thermoelectric conversion material constituted by a porous material formed from a sintered body, preparing a mixed powder by mixing a raw material powder of the sintered body with, as a void-forming material, microparticles having a particle size of 1 μm or less or a fibrous substance having a diameter of 1 μm or less; when molding and sintering the mixed powder, using an inert gas, a reduction gas, or a controlled oxidizing gas as the atmosphere and, while maintaining the void-forming material without vaporizing the void-forming material, densifying a solid portion formed by sintering the raw material powder; and, after the densification has progressed, removing the void-forming material from the sintered body by vaporizing, dissolving, or melting the void-forming material, thereby providing, in the sintered body, independent closed pores or independent closed tubes, which roughly correspond to the size of the microparticles or the fibrous substance that was removed.

CITATION LIST

Patent Literature

[PTL 1] JP 2006-53693 A
[PTL 2] WO2005/091393

SUMMARY OF INVENTION

Technical Problem

A thermoelectric material with lower thermal conductivity and lower electrical resistivity is provided.

Solution to Problem

A thermoelectric material according to the present invention includes a parent phase in which an MgSiSn alloy is a main component, a void formed in the parent phase, and a silicon layer that is formed on at least a wall surface of the void and that includes silicon as a main component.

It is preferable that the thermoelectric material according to the present invention further includes MgO in an amount of 1.0 wt. % or more and 20.0 wt. % or less with respect to the weight of the thermoelectric material.

It is preferable that the silicon layer is formed from amorphous Si, or from mixed Si including amorphous Si and microcrystalline Si.

It is preferable that the parent phase includes a first region and a second region in which chemical compositions of the MgSiSn alloy differ from each other, wherein a composition ratio of Sn in the first region is greater than in the second region, and a composition ratio of Si in the second region is greater than in the first region.

It is preferable that the first region is adjacent to the second region.

It is preferable that particles with a particle size smaller than particles at a center of the first region and particles with a particle size smaller than particles at a center of the second region are mixed at a boundary between the first region and the second region.

It is preferable that the void content is 5% or more and 50% or less with respect to the thermoelectric material.

It is preferable that Ge is substituted for a portion of the Sn of the MgSiSn alloy.

A thermoelectric module according to the present invention includes: an n-type thermoelectric material formed body doped with Al, P, As, Sb, or Bi; and a p-type thermoelectric material formed body doped with Ag, Li, Na, Cu, or Au, wherein the n-type thermoelectric material formed body and the p-type thermoelectric material formed body include a parent phase in which an MgSiSn alloy is a main component, a void formed in the parent phase, and a silicon layer adhering to at least a wall surface of the void.

Advantageous Effects of Invention

A thermoelectric material with lower thermal conductivity and lower electrical resistivity can be provided.

BRIEF DESCRIPTION OF DRAWINGS

FIG. 2A is a schematic diagram of a thermoelectric conversion device 2 using the thermoelectric material 1.

FIG. 2B is a schematic diagram of a thermoelectric module 3 using the thermoelectric conversion device 2.

FIG. 5A is an image of the thermoelectric material 1, captured by an FE-SEM.

FIG. 5B is an image illustrating energy dispersive X-ray analysis (EDX) element mapping analysis results of the thermoelectric material 1.

FIG. 5C illustrates electron beam backscatter diffraction (EBSD) analysis results of the thermoelectric material 1.

FIG. 8A illustrates the power factor (generated power per unit temperature difference) of three samples.

FIG. 8B illustrates the thermal conductivity of a plurality of lots fabricated on different days.

FIG. 13A is a graph showing the electrical resistivity of the n-type thermoelectric material formed body 22 of Example 4.

FIG. 13B is a graph showing the Seebeck coefficient of the n-type thermoelectric material formed body 22 of Example 4.

FIG. 13C is a graph showing the thermal conductivity of the n-type thermoelectric material formed body 22 of Example 4.

DESCRIPTION OF EMBODIMENTS

Figure 1:
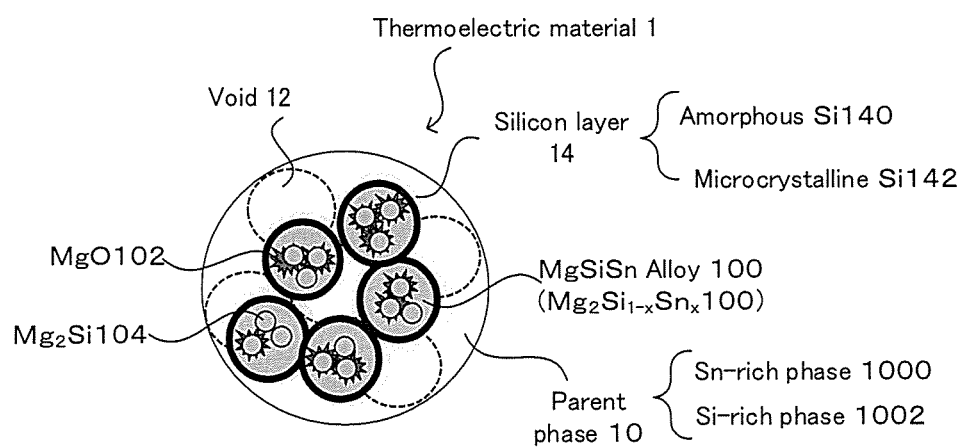
FIG. 1 is a schematic diagram of a thermoelectric material 1 according to an embodiment.

FIG. 1 is a schematic diagram of a thermoelectric material 1.

As illustrated in FIG. 1, the thermoelectric material 1 includes a parent phase 10 in which an MgSiSn alloy 100 is a main component, a void 12 formed in the parent phase 10, and a silicon layer 14 that is formed on at least a wall surface of the void 12 and that includes silicon as a main component. Specifically, the parent phase 10 includes the MgSiSn alloy 100 expressed by the chemical composition formula $Mg_2Si_{1-x}Sn_x$, MgO 102, and $Mg_2Si$ 104. The thermoelectric material 1 includes the MgO 102 in an amount of 1.0 wt. % or more and 20.0 wt. % or less with respect to the weight of the thermoelectric material 1. Furthermore, the parent phase 10 includes, in the MgSiSn alloy 100, a Sn-rich phase 1000 and a Si-rich phase 1002 that have different chemical compositions. The composition ratio of Sn in the Sn-rich phase 1000 is greater than that in the Si-rich phase 1002, and the composition ratio of Si in the Si-rich phase 1002 is greater than that in the Sn-rich phase 1000. The Sn-rich phase 1000 is an example of the first region according to the present invention, and the Si-rich phase 1002 is an example of the second region according to the present invention. The void content of the void 12 (the volume ratio of the void 12 in the thermoelectric material 1) is 5% or more and 50% or less. The silicon layer 14 that adheres to the wall surface of the void 12 includes amorphous Si 140, or amorphous Si 140 and microcrystalline Si 142.

FIG. 2A is a schematic diagram of a thermoelectric conversion device 2 using the thermoelectric material 1. FIG. 2B is a schematic diagram of a thermoelectric module 3 using the thermoelectric conversion device 2.

As illustrated in FIG. 2A, the thermoelectric conversion device 2 includes a p-type thermoelectric material formed body 20, an n-type thermoelectric material formed body 22, a high-temperature-side electrode 24 that joins the p-type thermoelectric material formed body 20 to the n-type thermoelectric material formed body 22, a low-temperature-side positive electrode 26 drawn out from the p-type thermoelectric material formed body 20, and a low-temperature-side negative electrode 28 drawn out from the n-type thermoelectric material formed body 22.

As illustrated in FIG. 2B, the voltage obtained in a single thermoelectric conversion device 2 is small and, as such, the thermoelectric module 3 includes a plurality of thermoelectric conversion devices 2 connected in series.

Figure 3:
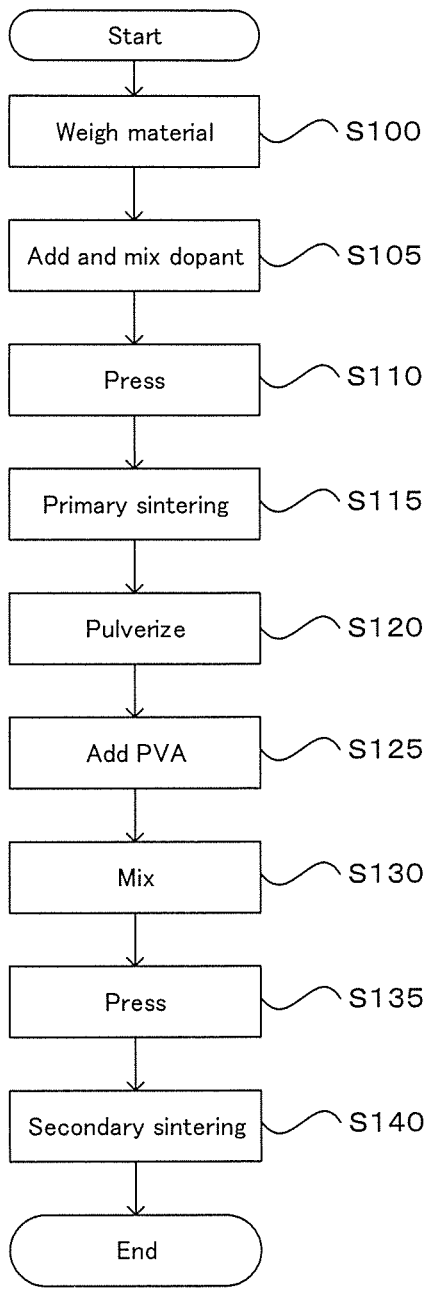
FIG. 3 is a flowchart of a method (S10) of manufacturing a thermoelectric material formed body.

FIG. 3 is a flowchart of a method (S10) of manufacturing a thermoelectric material formed body.

When using the thermoelectric material 1 as the thermoelectric conversion device 2, n-type and p-type thermoelectric materials 1 must be made. The p-type thermoelectric material 1 is formed by doping the MgSiSn alloy with Ag, Li, Na, Cu, or Au, and becomes the p-type thermoelectric material formed body 20.

The method of manufacturing the p-type thermoelectric material formed body 20 will be described in detail using FIG. 3.

In step 100 (S100), Mg, Si, and Sn are weighed so as to obtain a predetermined composition.

In step 105 (S105), a monovalent element such as Ag is added as a dopant to the Mg, Si, and Sn weighed in S100, and mixed.

In step 110 (S110), the raw material mixed in S105 is pressed and formed into a predetermined shape. It is desirable that the pressing pressure is the forming surface pressure of 5 MPa or more and 250 MPa or less. It is preferable that the forming surface pressure is from 20 MPa to 200 MPa. The term, "forming surface pressure" refers to a force that packs and compresses the material to a predetermined diameter.

In step S115 (S115), the formed raw material is subjected to primary sintering in an inert gas, and is cooled.

In step 120 (S120), the formed raw material that has been cooled is pulverized.

In step 125 (S125), polyvinyl alcohol (hereinafter referred to as "PVA") is added, as an additive, to the pulverized raw forming material.

In step 130 (S130), the raw forming material to which the PVA has been added is mixed.

In step 135 (S135), the raw forming material mixed in S130 is pressed and formed. It is desirable that the pressing pressure is forming surface pressure of 150 MPa or more and 3200 MPa or less.

In step 140 (S140), the raw forming material that has been pressed is subjected to secondary sintering in a vacuum or in an inert gas. As a result, the PVA is removed from the formed raw forming material, and the void 12 is created. It is preferable that a secondary sintering temperature is 700° C. or higher.

Steps 125 to 140 are defined as "void forming processing."

The n-type thermoelectric material 1 is formed by doping the MgSiSn alloy with Al, P, As, Sb, or Bi, and becomes the n-type thermoelectric material formed body 22.

The n-type thermoelectric material formed body 22 is fabricated according to the process illustrated in FIG. 3. Specifically, first, the Mg, Si, and Sn are weighed so as to obtain a predetermined composition. Then, a pentavalent element such as Sb is added as a dopant and mixed with the raw material of the n-type thermoelectric material. Then, the resulting mixture is subjected to primary sintering in an inert gas, cooled, and then pulverized. Then, PVA is added and mixed and, thereafter, the resulting mixture is pressed and formed. The resulting product is subjected to secondary sintering in an inert gas. Thus, the n-type thermoelectric material formed body 22 is produced.

Figure 4:
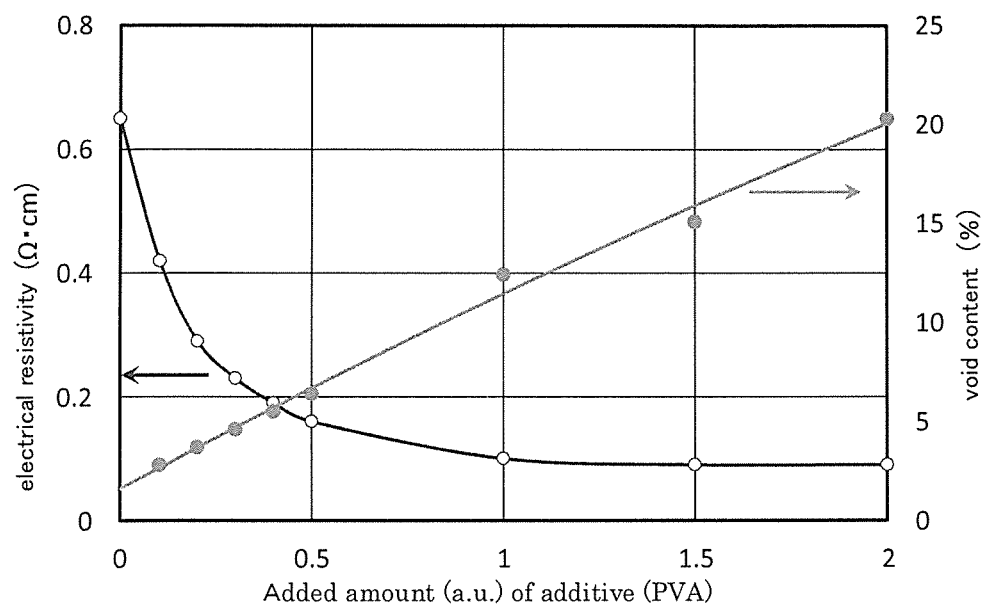
FIG. 4 is a graph showing the void content and the electrical resistivity caused by added amounts of polyvinyl alcohol (PVA), which is a void-forming material.

FIG. 4 is a graph showing the void content and the electrical resistivity of the thermoelectric material 1, caused by the PVA added amount.

As shown in FIG. 4, as the PVA added amount increases, the void content of the thermoelectric material 1 increases, and, also, the electrical resistivity of the thermoelectric material 1 rapidly decreases. Typically, the electrical resistivity increases as the void content increases. However, with the thermoelectric material 1, the electrical resistivity holds at 0.1 Ω·cm even when the void content is 20%. Thus, it is clear that the thermoelectric material 1 maintains low electrical resistivity, even when the void content increases. Accordingly, it is possible to significantly reduce the electrical resistivity of the thermoelectric material 1, that is, the MgSiSn alloy 100, by adding the PVA. This reduction in electrical resistance leads to improvements in the thermoelectric properties of the MgSiSn alloy 100. Moreover, one of the factors for the realization of low electrical resistivity is the amorphous Si 140 and the microcrystalline Si 142 that adheres around the void 12 produced via the void forming processing of the MgSiSn alloy to which the PVA has been added.

FIG. 5A is an image of the thermoelectric material 1, captured by an FE-SEM.

FIG. 5B is an image illustrating energy dispersive X-ray analysis (EDX) element mapping analysis results in the analysis range illustrated in FIG. 5A. FIG. 5C illustrates electron beam backscatter diffraction (EBSD) analysis results in the analysis range illustrated in FIG. 5A.

As illustrated in FIG. 5A, it is clear that the void 12 is formed in the thermoelectric material 1.

FIG. 5B illustrates the EDX element analysis results in the analysis range illustrated in FIG. 5A. Mg, Sn, Si, C, and O were confirmed. The C is residual carbon of the PVA after the secondary sintering in the forming process of the thermoelectric material formed body. The O is due to the MgO 102 reaction product produced by the reaction between the MgSiSn alloy and the PVA. Si was confirmed around the void 12. This was caused by the amorphous Si 140 and the microcrystalline Si 142.

FIG. 5C illustrates the EBSD analysis results. In these analysis results, the presence of a region, namely the Sn-rich phase 1000, in which the composition ratio of Sn is higher than in other regions, and a region, namely the Si-rich phase 1002, in which the composition ratio of Si is higher than in other regions were confirmed in the parent phase 10. This is effective for increasing the power factor. Furthermore, the EBSD analysis results depict that the Sn-rich phase 1000 and the Si-rich phase 1002 are adjacent to each other, and illustrate the mixing of particles with a particle size smaller than the bulk particles of the Sn-rich phase 1000 and particles with a particle size smaller than the bulk particles of the Si-rich phase 1002 at the boundary between the Sn-rich phase 1000 and the Si-rich phase 1002. In other words, the size of the particles at the grain boundary varies and, as such, the thermal conductivity of the thermoelectric material 1 can be reduced by Phonon scattering.

Figure 6:
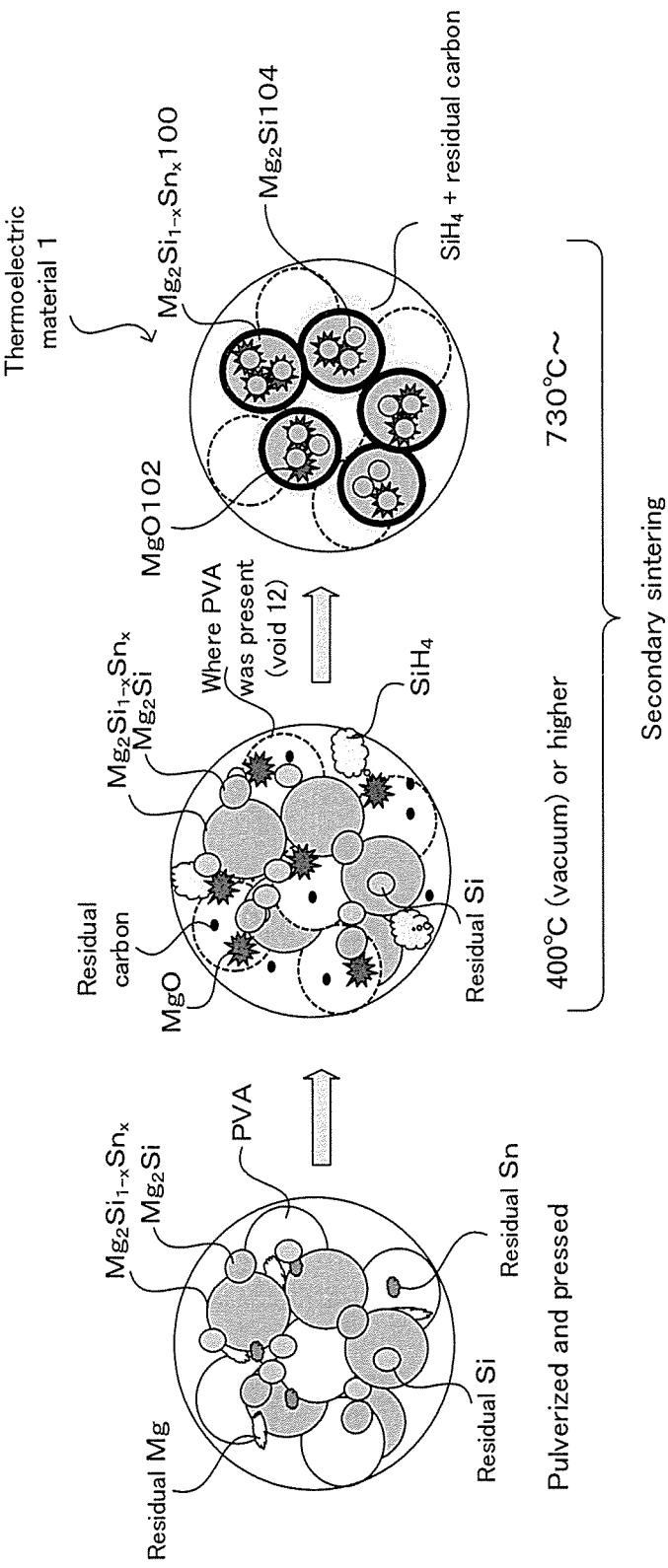
FIG. 6 is a schematic diagram illustrating the reaction mechanism of MgSnSi alloy in secondary sintering.

FIG. 6 is a schematic diagram illustrating the reaction mechanism of the secondary sintering in the production of the thermoelectric material 1.

As illustrated in FIG. 6, in the pulverized and pressed MgSiSn alloy to which the PVA has been added, the PVA thermally decomposes at 200° C. or higher in a vacuum or in an inert gas, thereby removing the PVA from the MgSiSn alloy (vaporization of PVA). As a result, the void 12 is formed where the PVA was present (void forming processing). In the secondary sintering, the MgO 102, SiH$_4$, and residual carbon of the additive are produced at the same time the PVA is vaporized. Next, the MgO 102 is distributed in the MgSiSn crystal structure grain boundary at 730° C. or higher, thus forming a stable mixed phase. Then, the amorphous Si 140 (a-Si:H), or the amorphous Si 140 and the microcrystalline Si 142, are deposited on the wall surface of the void 12.

The amorphous Si is a stable solid in which Si atoms are randomly bonded to each other and hydrogen is bonded to the dangling bonds. The electrical and optical characteristics of amorphous Si change significantly depending on the composition and the manufacturing method. Amorphous Si is used in solar cells and thin film transistors (TFT). Amorphous Si can be film formed using monosilane (SiH$_4$) as a raw material, at a low temperature (200° C. to 500° C.) via a vacuum deposition method or the like. It is known that monosilane can be produced from magnesium silicate and hydrochloric acid on the basis of the following chemical reaction formula (1). In the same manner, monosilane (SiH$_4$) is produced in the PVA and the MgSiSn alloy in the secondary sintering on the basis of the following chemical reaction formula (2). The silane thermally decomposes at 400° C. or higher, and the amorphous Si 140, or the amorphous Si 140 and the microcrystalline Si 142, are deposited on the wall surface of the void 12.

$$Mg_2Si + 4HCl \rightarrow 2MgCl_2 + SiH_4 \quad (1)$$

$$Mg_2Si + (CH_2-CH(OH))_n \rightarrow 2C + 2MgO + SiH_4 \quad (2)$$

Next, details of the reaction mechanism that results from temperature rises during the secondary sintering will be described.

A case is described in which, in Mg$_2$Si$_{1-x}$Sn$_x$, where x≈0.7, is the starting composition.

In the secondary sintering, when the temperature exceeds 200° C., the PVA begins to decompose, the reaction of the following chemical reaction formula (3) proceeds, and Mg$_2$Sn and Si are produced.

$$Mg_2Si_{0.3}Sn_{0.7} + (CH_2-CH(OH))_n \rightarrow Mg_2Sn + 2C + 2MgO + SiH_4 \quad (3)$$

Next, since the microcrystalline Si acts as a catalyst of the SiH$_4$, the amorphous Si adheres around the void formed where the PVA was present.

Then, since the decomposition of the PVA completes when the temperature exceeds 600° C., the unreacted Mg$_2$Sn near the residual Si uses the residual Mg (including Mg in the evaporating dish) and the residual Si as the raw material to produce a chemical composition region of $Mg_2Si_{0.3}Sn_{0.7}$.

Figures 7A, 7B:
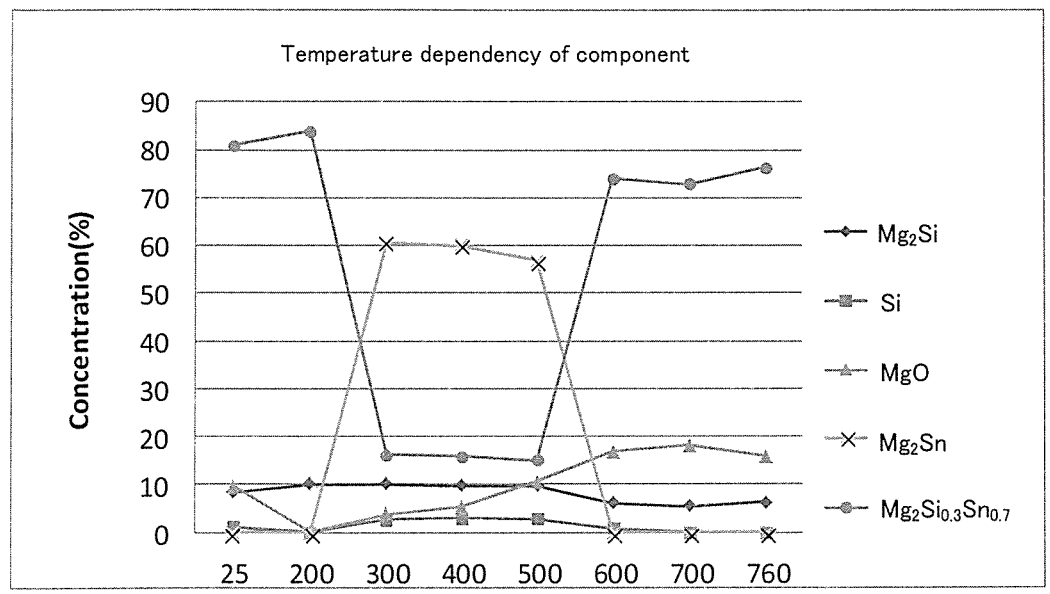
FIG. 7A is a table showing the content of each component by temperature.
FIG. 7B is a graph showing a secondary sintering temperature and a concentration of each component.

FIG. 7A is a table showing the content of each component by temperature. FIG. 7B is a graph showing the secondary sintering temperature and the concentration of each component.

As shown in FIG. 7B, it is clear that, in the secondary sintering, the concentration of the $Mg_2Si_{0.3}Sn_{0.7}$ decreases and the concentrations of the $Mg_2Sn$ and the Si increase at 200° C. or higher, and the concentration of the $Mg_2Si_{0.3}Sn_{0.7}$ is near the original concentration at 600° C. or higher. That is, FIG. 7 elucidates the reaction mechanism that results from temperature rises during the secondary sintering. Meanwhile, crystal growth is suppressed near the void due to the pinning effects resulting from residual carbon and MgO, which are produced at the same time as the $SiH_4$, precipitating on the grain boundary of the $Mg_2Sn$. As a result, the crystal grains are fine. Further, the raw material Si is no longer supplied by the fine crystal grains, the $Mg_2Si_{0.3}Sn_{0.7}$ chemical composition region is not produced and, instead, a $Mg_2Si_{0.1}Sn_{0.9}$ chemical composition region, which is the Sn-rich phase 1000, is formed so as to encompass the Si-rich phase 1002.

It can be confirmed from FIG. 7B that the concentration of the MgO in the thermoelectric material 1 is near 20% when the secondary sintering temperature is 700° C. or higher. Since the electrical conductivity of MgO is low, MgO is typically considered to be an impurity in thermoelectric materials. As such, functionality as a thermoelectric material declines when the content of MgO in the thermoelectric material is near 20%. However, in the thermoelectric material 1, the pinning effect of the MgO 102 contributes to the formation of the stable mixed phase and, as such, realizes the power factor of the thermoelectric material 1. Moreover, the low electrical conductivity of the MgO 102 is compensated for by the amorphous Si 140 and the microcrystalline Si 142 around the void. As such, the thermoelectric material 1 realizes high conductivity.

Next, the reproducibility of the thermoelectric material 1 will be described.

FIG. 8A illustrates the power factors of three samples of the thermoelectric material 1. As illustrated in FIG. 8A, it is clear that, in the three samples, the power factor graphs substantially overlap and there is hardly any variation. In other words, these results indicate that sample reproducibility is high.

Furthermore, FIG. 8B illustrates the thermal conductivity of a plurality of lots fabricated on different days. As illustrated in FIG. 8B, it is clear that the thermal conductivity graphs of the lots substantially overlap and there is hardly any variation. In other words, these results indicate that lot reproducibility is also high. Thus, it is possible to stably produce the thermoelectric material 1 using the manufacturing method of FIG. 3.

Next, the thermoelectric performance of the thermoelectric material 1 will be described.

The thermoelectric performance of the thermoelectric material is evaluated on the basis of a performance indicator Z. The performance indicator Z is defined by the following formula (4) using the Seebeck coefficient S, the electrical resistivity ρ, and the thermal conductivity κ of the material.

The power factor (PF) of the thermoelectric material corresponds to the generated power per unit temperature difference, and is defined by the following formula (5) using the Seebeck coefficient S and the electrical resistivity ρ of the material.

$$Z = S^2/\rho\kappa \quad (4)$$

$$PF = S^2/\rho \quad (5)$$

That is, when the performance indicator Z is high, the Seebeck coefficient S is great, the electrical resistivity ρ is low, and the thermal conductivity κ is low. Higher power factors PF are more desirable. The dimension is the reciprocal of temperature, that is, 1/K. Further, ZT multiplied by the temperature at the time of measurement is dimensionless and is referred to as a dimensionless performance indicator. The dimensionless performance indicator is used in the evaluation of the thermoelectric performance of the thermoelectric material.

ZT>1 is a baseline for viability.

Figure 9B:
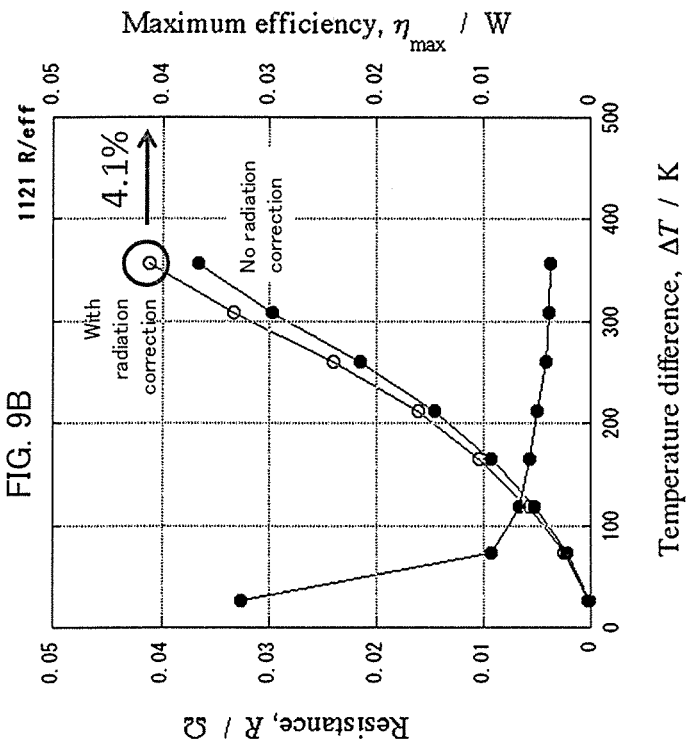
FIG. 9B is a graph showing thermoelectric conversion efficiency.
Figure 9A:
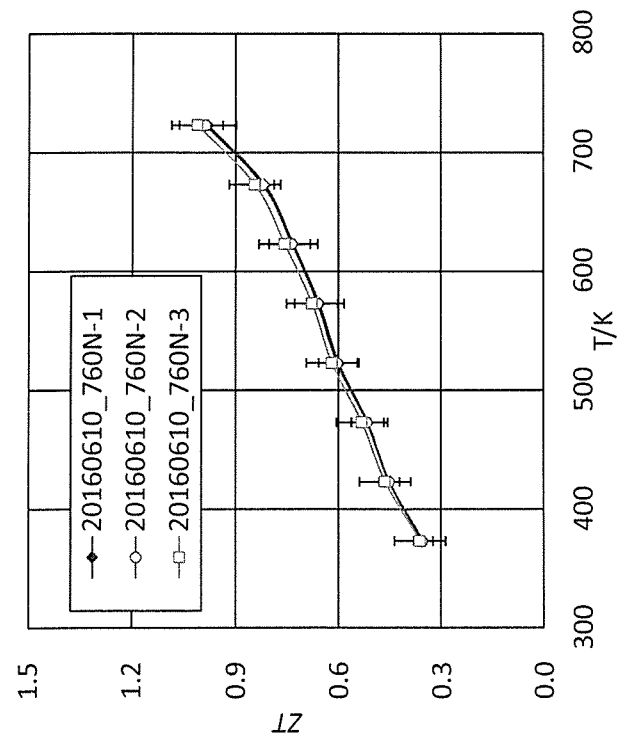
FIG. 9A is a graph showing ZT, which is a performance indicator of each sample.

FIG. 9A is a graph showing the ZT, which is the performance indicator, of each of the samples of FIG. 7B.

The ZT is calculated by measuring the thermal conductivity, dividing by the power factor, and multiplying by the temperature at the time of measurement. It is clear that ZT=1 was achieved for all of the samples of the thermoelectric material 1.

FIG. 9B is a graph showing the thermoelectric conversion efficiency of the thermoelectric material 1. Generation efficiency of 4.1% was obtained near ΔT=370.

Figure 10:
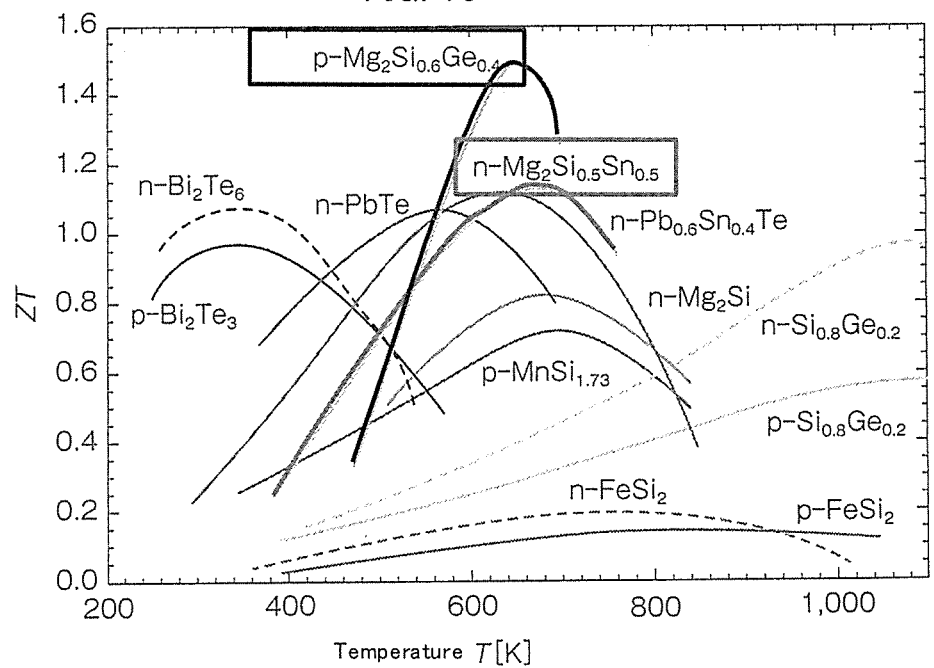
FIG. 10 is a graph showing the ZT of a thermoelectric material 1 in which Ge has been substituted for a portion of Sn of the MgSiSn alloy.

FIG. 10 is a graph showing the ZT of the thermoelectric material 1 in which Ge has been substituted for a portion of the Sn in the MgSiSn alloy. FIG. 10 indicates that ZT=1.5 near temperatures of 640 K. Thus, it is clear from the graph that performance equivalent to that of the MgSiSn alloy can be obtained, even when Ge is substituted for the Sn.

Next, the present invention is described in more detail using examples. However, the present invention is not limited to the conditions used in the following examples.

Example 1

Method of Manufacturing n-Type Thermoelectric Material Formed Body 22

Following the method (S10) of manufacturing the thermoelectric material formed body illustrated in FIG. 3, the raw materials are mixed such that the weight ratios of the Mg, Si, Sn, and Sb are 35.9%, 5.4%, 57.0%, and 1.7%, which corresponds to the composition of $Mg_{2.15}Si_{0.28}Sn_{0.70}Sb_{0.02}$. The mixed raw materials are pressed and formed, and then sintered at a temperature of 650° C. in a vacuum or in an inert gas (primary sintering). If this sintering temperature is 500° C. or lower, the solid phase reaction will not proceed, but if 750° C. or higher, it will be difficult to produce the compound (the MgSiSn alloy 100), which is the main component of the thermoelectric material. Accordingly, it is preferable that the sintering temperature is 500° C. or higher and 750° C. or lower.

The thermoelectric material that has been subjected to the primary sintering is pulverized into a powder in a vacuum or in an inert gas. Then, 4.5% by weight ratio of PVA powder is added and mixed in a vacuum or in an inert gas. The resulting mixture is pressed and formed, and then sintered at a temperature of 730° C. in an inert gas (secondary sintering). Thus, the n-type thermoelectric material formed body 22 having the structure illustrated in FIG. 1 is produced.

Performance of n-Type Thermoelectric Material Formed Body 22

Figure 11A:
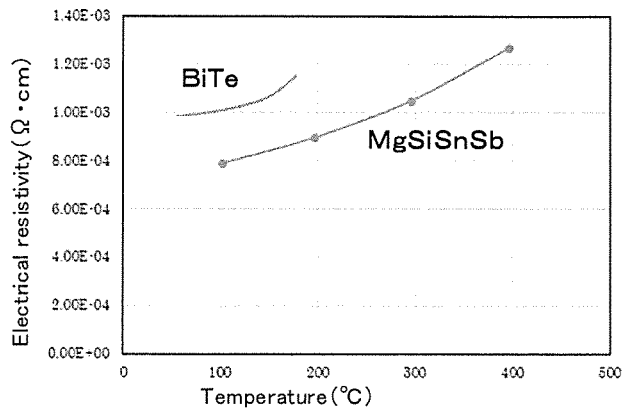
FIG. 11A is a graph showing the electrical resistivity of an n-type thermoelectric material formed body 22 of Example 1.
Figure 11B:
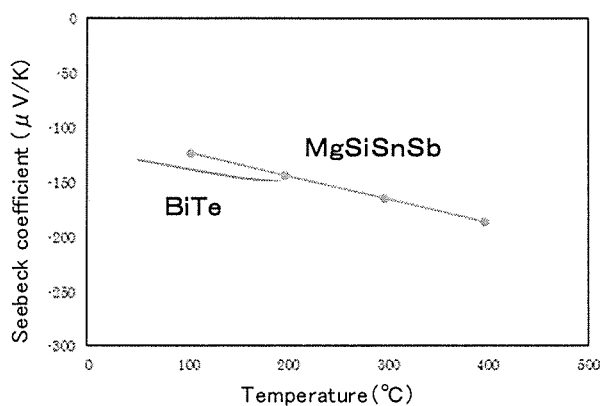
FIG. 11B is a graph showing the Seebeck coefficient of the n-type thermoelectric material formed body 22 of Example 1.

FIG. 11A is a graph showing the electrical resistivity of the $Mg_{2.15}Si_{0.25}Sn_{0.70}Sb_{0.02}$ to which 4.5 wt. % of PVA has been added. FIG. 11B is a graph showing the Seebeck coefficient of the $Mg_{2.15}Si_{0.25}Sn_{0.70}Sb_{0.02}$ to which 4.5 wt.

Figure 11C:
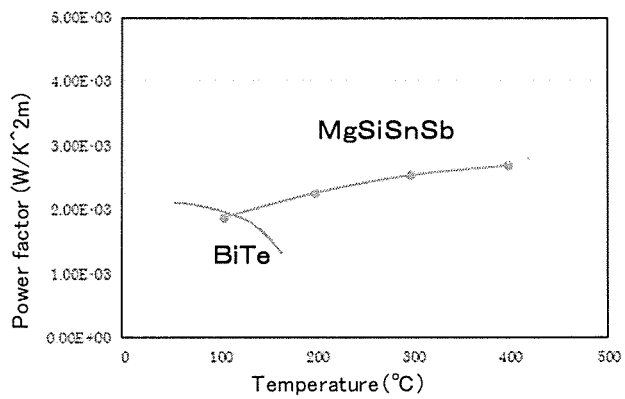
FIG. 11C is a graph showing the power factor of the n-type thermoelectric material formed body 22 of Example 1.

% of PVA has been added. FIG. 11C is a graph showing the power factor of the $Mg_{2.15}Si_{0.25}Sn_{0.70}Sb_{0.02}$ to which 4.5 wt. % of PVA has been added.

The properties of a bismuth tellurium alloy (BiTe) when used as a thermoelectric material are also shown in the graphs. The power factor is expressed as $S^2/\rho$, which is obtained by dividing the square of the Seebeck coefficient by the electrical resistivity. The power factor is primarily used as a measure of the output of the thermoelectric material. As shown in FIG. 11C, at 100° C. or higher, results are obtained in which the power factor of the $Mg_{2.15}Si_{0.28}Sn_{0.70}Sb_{0.02}$ is superior to that of $Bi_2Te_3$.

FIG. 9A illustrates the results of calculating the ZT by measuring the thermal conductivity of the $Mg_{2.15}Si_{0.28}Sn_{0.70}Sb_{0.02}$, dividing by the power factor, and multiplying by the temperature at the time of measurement. The n-type thermoelectric material formed body 22 having the composition of $Mg_{2.15}Si_{0.28}Sn_{0.70}Sb_{0.02}$ achieves ZT=1.

Example 2

Method of Manufacturing p-Type Thermoelectric Material Formed Body 20

Mg, Si, Sn, and Ag are mixed such that the weight ratios are 35.9%, 5.4%, 57.0%, and 1.7%, which corresponds to a composition of $Mg_{2.00}Si_{0.30}Sn_{0.70}Ag_{0.02}$ and, following the flowchart for sample fabrication illustrated in FIG. 3, the mixture is pulverized, pressed, and formed, and then is sintered at 650° C. in a vacuum or in an inert gas (primary sintering).

The sintered product is pulverized into a powder in a vacuum or in an inert gas, and then 4.0% by weight ratio of PVA powder is added and thoroughly mixed in a vacuum or in an inert gas.

The resulting mixture is pressed and formed, and then sintered at 750° C. in an inert gas (secondary sintering). Thus, the p-type thermoelectric material formed body 20 is produced.

PVA Added Amount in p-Type Thermoelectric Material Formed Body 20

Figure 12A:
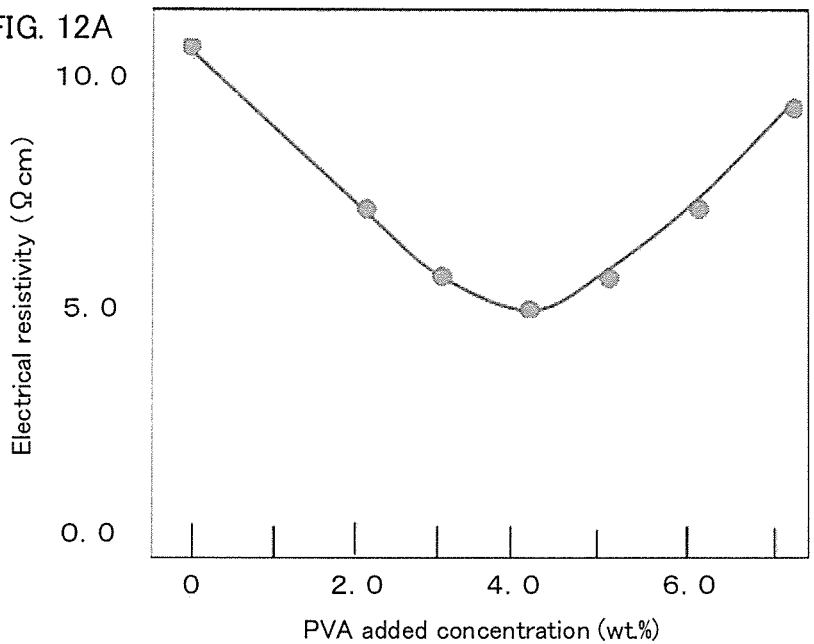
FIG. 12A is a graph showing the added concentration of PVA and changes in the electrical resistivity in the p-type thermoelectric material formed body 20 of Example 2.

As with the n-type thermoelectric material formed body 22, adding 4.0% by weight ratio of PVA reduces the electrical resistivity of the p-type thermoelectric material formed body 20. FIG. 12A is a graph showing the added concentration of the PVA and changes in the electrical resistivity in the p-type thermoelectric material formed body 20. In the p-type thermoelectric material formed body 20, reductions in the electrical resistivity were observed up to a PVA added amount of 5 wt. %. Accordingly, improvements in thermoelectric properties were observed that correspond to the reduction in resistance.

Example 3

PVA Added Amount in n-Type Thermoelectric Material Formed Body 22

Figure 12B:
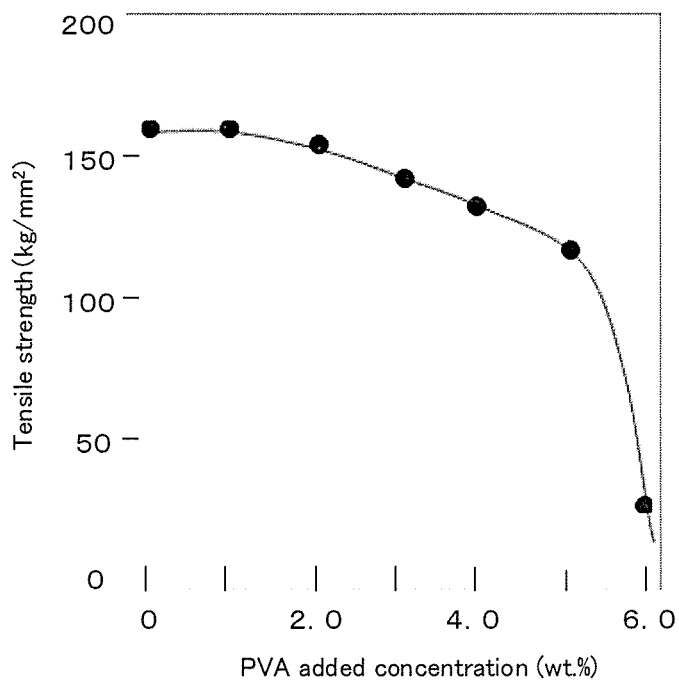
FIG. 12B is a graph showing the added concentration of the PVA and the tensile strength in the n-type thermoelectric material formed body 22 of Example 3.

FIG. 12B is a graph showing the tensile strength with respect to a thermoelectric material in which 1.0 wt. % to 6.0 wt. % of PVA is added to the n-type $Mg_{2.15}Si_{0.28}Sn_{0.70}Sb_{0.020}$. The fabrication method is the same as described in Example 1. It is clear that the tensile strength decreases as the PVA added amount increases. Thus, it is preferable that the PVA added amount is limited so as to maintain material strength. Accordingly, when emphasizing the strength of the thermoelectric material, it is preferable that the added concentration of the PVA is 5 wt. % or less.

Example 4

Method of Manufacturing n-Type Thermoelectric Material Formed Body 22

Following the method (S10) of manufacturing the thermoelectric material formed body illustrated in FIG. 3, raw materials are mixed such that the weight ratios of the Mg, Si, Sn, and Sb are 36%, 5%, 57%, and 2%, which corresponds to the composition of $Mg_{2.2}Si_{0.28}Sn_{0.70}Sb_{0.02}$. The mixed raw materials are pressed and molded, and then sintered at a temperature of 650° C. in a vacuum or in an inert gas (primary sintering). If this sintering temperature is 500° C. or lower, the solid phase reaction will not proceed, but if 750° C. or higher, it will be difficult to produce the compound (MgSiSn) that is the main component of the thermoelectric material. Accordingly, it is preferable that the sintering temperature is 500° C. or higher and 750° C. or lower.

The thermoelectric material that has been subjected to the primary sintering is pulverized into a powder in a vacuum or in an inert gas. Then, 6.8% by weight ratio of PVA powder is added and mixed in a vacuum or in an inert gas. From the perspective of controlling the void content, it is preferable that the added amount of the PVA is from 4.5% to 13.5%. The resulting mixture is pressed and formed, and then sintered at a temperature of 775° C. in an inert gas (secondary sintering).

Figure 14:
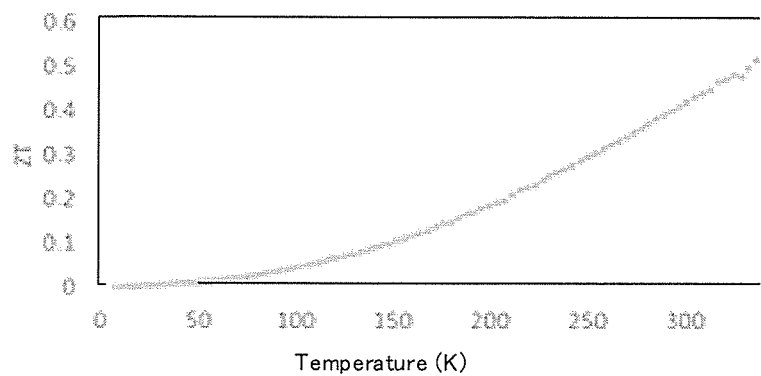
FIG. 14 is a graph showing the ZT of the n-type thermoelectric material formed body 22 of Example 4.

FIG. 13A is a graph showing the electrical resistivity, FIG. 13B is a graph showing the Seebeck coefficient, and FIG. 13C is a graph showing the thermal conductivity, and FIG. 14 is a graph showing the ZT calculated from the electrical resistivity, the Seebeck coefficient, and the thermal conductivity, of the n-type thermoelectric material formed body 22 manufactured under the conditions described above. (Physical Property Measurement System PPMS, manufactured by Quantum Design Japan, Inc.) It is noted that the measuring temperature region of the PPMS is from 7 to 340 K and that silver paste is used to join the sample to the terminal. The thermal conductivity was measured using the steady heat flow method, and the electrical resistivity was measured using the AC four-terminal measuring method.

It is clear from the various thermoelectric conversion materials illustrated in FIG. 10 that performance of all materials, except for BiTe, is low in the low temperature region of 100° C. or lower. However, FIG. 14 illustrates that the n-type thermoelectric material formed body 22 of Example 4 demonstrates high performance, that is, the dimensionless performance indicator ZT=0.5, at a comparatively low temperature of 60° C.

Figure 15A:
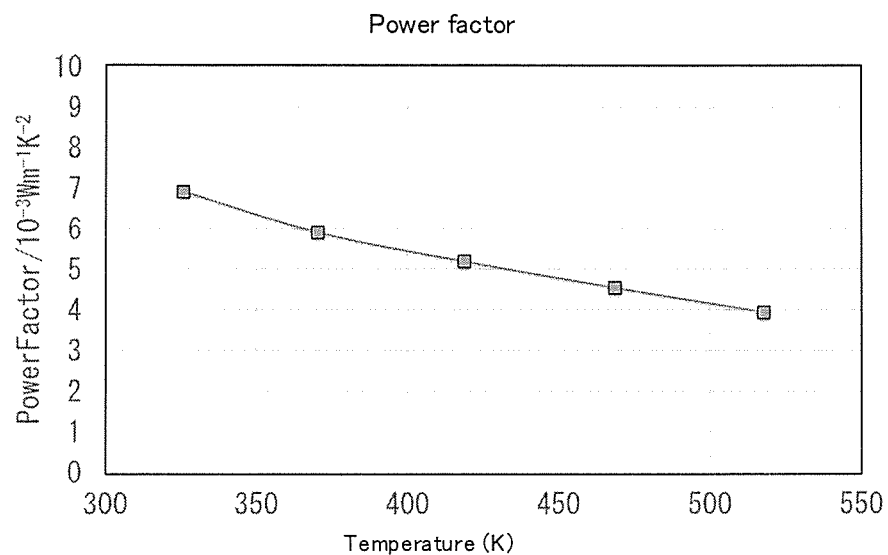
FIG. 15A is a graph showing the power factor, measured using a thermoelectric property measurement device, of the n-type thermoelectric material formed body 22 of Example 4.
Figure 15B:
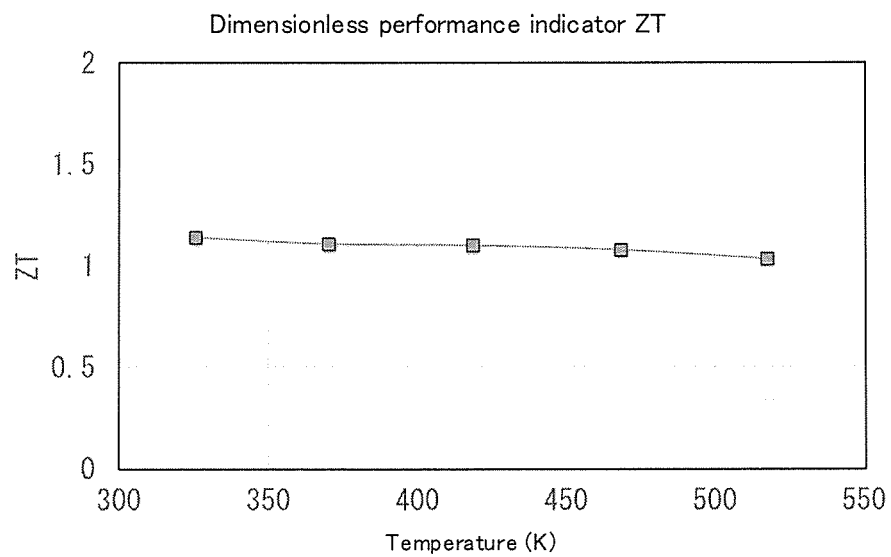
FIG. 15B is a graph showing the ZT, measured by a laser flash method thermal constant measurement device, of the n-type thermoelectric material formed body 22 of Example 4.

FIG. 15A is a graph showing the power factor, measured using Thermoelectric Property Measurement Device RZ2001i (manufactured by Ozawa Science Co., Ltd.), of the n-type thermoelectric material formed body 22 of Example 4. FIG. 15B is a graph showing the ZT, measured using Laser Flash Method Thermal Constant Measurement Device TC-9000 (manufactured by Advance Riko, Inc.), of the n-type thermoelectric material formed body 22 of Example 4. According to these results, the n-type thermoelectric material formed body 22 of Example 4 demonstrates a ZT of 1 or greater.

As described above, the thermoelectric material 1 according to the present embodiment includes the parent phase 10 in which the MgSiSn alloy 100 is a main component and the void 12 formed in the parent phase 10, and the silicon layer 14 is formed on at least the wall surface of the void 12. The silicon layer 14 includes the amorphous Si 140 and the microcrystalline Si 142, and is effective in reducing the electrical resistance of the thermoelectric material 1. Further, the parent phase 10 includes the Sn-rich phase 1000 and the Si-rich phase 1002, and is effective for increasing the power factor of the thermoelectric material 1. Moreover, particles with particles sizes that are smaller than the bulk of each phase are mixed at the boundary between the Sn-rich phase 1000 and the Si-rich phase 1002, and this is effective for lowering thermal conductivity. Furthermore, the content of the MgO, which is typically considered an impurity in thermoelectric materials, in the thermoelectric material 1 is high, and the stable formation of the mixed phase due to the MgO 102 also contributes to the thermoelectric performance of the thermoelectric material 1. With these structures, the thermoelectric material 1 can simultaneously achieve low thermal conductivity and low electrical resistivity, and the thermoelectric material 1 can achieve ZT>1.

Further, it is preferable that the temperature change and sintering time of the secondary sintering are suited for the precipitation of silicon and MgO on the void wall surface of the MgSiSn alloy. For example, from the perspective of realizing quality stabilization of the thermoelectric material 1, it is preferable that the secondary sintering temperature is 700° C. or higher.

REFERENCE SINGS LIST

1 Thermoelectric material
2 Thermoelectric element
3 Thermoelectric module
10 Parent phase
12 Void
14 Silicon layer
20 p-type thermoelectric material formed body
22 n-type thermoelectric material formed body
24 High-temperature-side electrode
26 Low-temperature-side positive electrode
28 Low-temperature-side negative electrode
100 MgSnSi alloy
102 MgO
140 Amorphous Si
142 Microcrystalline Si
104 $Mg_2Si$
1000 Sn-rich phase
1002 Si-rich phase

The invention claimed is:

1. A thermoelectric material, comprising:
   a parent phase including an MgSiSn alloy as a main component;
   a void formed in the parent phase, wherein the void is an empty space; and
   a silicon layer formed on a wall surface of the parent phase in the void, the silicon layer including silicon as a main material, wherein the void remains empty although the wall surface of the parent phase in the void has the silicon layer.

2. The thermoelectric material according to claim 1, wherein:
   the parent phase includes a first region and a second region in which chemical compositions of the MgSiSn alloy differ from each other;
   a composition ratio of Sn in the first region is higher than in the second region; and
   a composition ratio of Si in the second region is higher than in the first region.

3. The thermoelectric material according to claim 2, wherein the first region is adjacent to the second region.

4. The thermoelectric material according to claim 2, wherein
   particles with a particle size smaller than particles at a center of the first region and particles with a particle size smaller than particles at a center of the second region are mixed at a boundary between the first region and the second region.

5. The thermoelectric material according to claim 1, wherein the void content is 5% or more and 50% or less with respect to the thermoelectric material.

6. The thermoelectric material according to claim 1, wherein Ge is substituted for a portion of the Sn of the MgSiSn alloy.

7. The thermoelectric material according to claim 1, wherein the silicon layer is a solid in which Si atoms are bonded to each other.

8. The thermoelectric material according to claim 1, wherein the silicon layer is a vapor deposited film of silicon.

9. A thermoelectric module, comprising:
   an n-type thermoelectric material formed body doped with Al, P, As, Sb, or Bi; and
   a p-type thermoelectric material formed body doped with Ag, Li, Na, Cu, or Au, wherein the n-type thermoelectric material formed body and the p-type thermoelectric material formed body include:
   a parent phase including an MgSiSn alloy as a main component;
   a void formed in the parent phase, wherein the void is an empty space; and
   a silicon layer formed on a wall surface of the parent phase in the void, the silicon layer including silicon as a main material, wherein the void remains empty although the wall surface of the parent phase in the void has the silicon layer.

* * * * *